(12) United States Patent
Huwer et al.

(10) Patent No.: US 10,613,183 B2
(45) Date of Patent: Apr. 7, 2020

(54) METHOD AND MAGNETIC RESONANCE APPARATUS FOR DETERMINING DIFFUSION PARAMETERS

(71) Applicant: Siemens Healthcare GmbH, Erlangen (DE)

(72) Inventors: Stefan Huwer, Erlangen (DE); Thorsten Feiweier, Poxdorf (DE)

(73) Assignee: Siemens Healthcare GmbH, Erlangen (DE)

( * ) Notice: Subject to any disclaimer, the term of this patent is extended or adjusted under 35 U.S.C. 154(b) by 49 days.

(21) Appl. No.: 15/958,325

(22) Filed: Apr. 20, 2018

(65) Prior Publication Data
US 2018/0306885 A1 Oct. 25, 2018

(30) Foreign Application Priority Data
Apr. 21, 2017 (EP) .................................... 17167484

(51) Int. Cl.
*G01R 33/563* (2006.01)
*G01R 33/56* (2006.01)

(52) U.S. Cl.
CPC ... *G01R 33/56341* (2013.01); *G01R 33/5608* (2013.01)

(58) Field of Classification Search
CPC .............................................. G01R 33/56341
USPC ................................................. 324/309, 307
See application file for complete search history.

(56) References Cited

U.S. PATENT DOCUMENTS

| 10,302,723 B2 * | 5/2019 | Manikis | ............ G01R 33/5608 |
| 2015/0301142 A1 | 10/2015 | Griswold et al. | |
| 2016/0356873 A1 * | 12/2016 | Topgaard | ............... A61B 5/055 |
| 2019/0223789 A1 * | 7/2019 | Wang | .................... A61B 5/055 |

OTHER PUBLICATIONS

Pierre, et al.; "Multiscale Reconstruction for MR Fingerprinting."; Magnetic Resonance in Medicine; vol. 75; pp. 2481-2492; (2016).
Ma, et al.: "Magnetic resonance fingerprinting";: Nature; vol. 495; pp. 187-193; (2013).
Assaf et al.: "Diffusion Tensor Imaging (DTI)-based White Matter Mapping in Brain Research: A Review";: Journal of Molecular Neuroscience; vol. 34, No. 1; pp. 51-61;( 2008).

(Continued)

*Primary Examiner* — Melissa J Koval
*Assistant Examiner* — Rahul Maini
(74) *Attorney, Agent, or Firm* — Schiff Hardin LLP

(57) ABSTRACT

In a magnetic resonance (MR) method and apparatus, MR signals are acquired in multiple diffusion measurements using a defined set of parameters in the respective measurements that differ in terms of at least one MR parameter from measurement-to-measurement, thereby producing a measured MR signal dataset. Multiple calculated datasets are calculated using a model, with a defined number of model parameters in each calculated dataset, but in different combinations, with each calculated dataset having an MR signal intensity. The measured MR signal having a closest match to the measured MR signal dataset, using a quality criterion based on the MR signal intensity, is identified, and the diffusion parameter is obtained from the calculated dataset having the closest match.

13 Claims, 5 Drawing Sheets

(56) References Cited

OTHER PUBLICATIONS

Jiang, et al.: "Simultaneous TI, T2 and Diffusion Quantification using Multiple Contrast Prepared Magnetic Resonance Fingerprinting";; Proc. Intl. Soc. Mag. Resort. Med.; vol. 25; pp. 1171-1173; (2017).
Sakaie,: "Feasibility of Diffusion Tensor Imaging with Magnetic Resonance Fingerprinting"; in: Proc. Ingl. Soc. Mag. Reson. Med.; vol. 22; p. 2557; (2014).
Basser, et al: "Diffusion-tensor MRI: theory, experimental design and data analysis—a technical review"; NMR in Biomedicine; vol. 15; pp. 456-467; (2002).
Kingsley, "Introduction to Diffusion Tensor Imaging Mathematics: Part II. Anisotropy, Diffusion-Weighting Factors, and Gradient Encoding Schemes";: Magnetic Resonance Part A; vol. 28A, No. 2; pp. 123-154; (2006).
Coppo, et al.: "Overview of Magnetic Resonance Fingerprinting"; MAGNETOM Flash; vol. 65, No. 2; pp. 12-21; (2016).

* cited by examiner

|  | 31 | 32 | 33 | 34 |  |
|---|---|---|---|---|---|
|  |  | M0 | ADC | S'=M0*exp(-b*ADC) | |
|  |  |  |  | b0 | b1 | b2 |
|  |  |  |  | 0 | 1000 | 2000 |
| 0 | 0 | 0 | 0 | 0 | 0 |
| 1 | 1000 | 0 | 1000 | 1000 | 1000 |
| 2 | 1000 | 1 | 1000 | 367,8794 | 135,3353 |
| 3 | 1000 | 2 | 1000 | 135,3353 | 18,31564 |
| 4 | 1000 | 3 | 1000 | 49,78707 | 2,478752 |
| 5 | 1000 | 4 | 1000 | 18,31564 | 0,335463 |
| 6 | 2000 | 0 | 2000 | 2000 | 2000 |
| 7 | 2000 | 1 | 2000 | 735,7589 | 270,6706 |
| 8 | 2000 | 2 | 2000 | 270,6706 | 36,63128 |
| 9 | 2000 | 3 | 2000 | 99,57414 | 4,957504 |
| 10 | 2000 | 4 | 2000 | 36,63128 | 0,670925 |
| 11 | 3000 | 0 | 3000 | 3000 | 3000 |
| 12 | 3000 | 1 | 3000 | 1103,638 | 406,0058 |
| 13 | 3000 | 2 | 3000 | 406,0058 | 54,94692 |
| 14 | 3000 | 3 | 3000 | 149,3612 | 7,436257 |
| 15 | 3000 | 4 | 3000 | 54,94692 | 1,006388 |
| 16 | 4000 | 0 | 4000 | 4000 | 4000 |
| 17 | 4000 | 1 | 4000 | 1471,518 | 541,3411 |
| 18 | 4000 | 2 | 4000 | 541,3411 | 73,26256 |
| 19 | 4000 | 3 | 4000 | 199,1483 | 9,915009 |
| 20 | 5000 | 0 | 5000 | 5000 | 5000 |
| 21 | 5000 | 1 | 5000 | 1839,397 | 676,6764 |
| 22 | 5000 | 2 | 5000 | 676,6764 | 91,57819 |
| 23 | 5000 | 3 | 5000 | 248,9353 | 12,39376 |
| 24 | 5000 | 4 | 5000 | 91,57819 | 1,677313 |

| | 36a | 36b | 36c | 36d | 35 |
|---|---|---|---|---|---|
| b=0 | 1000 | 2100 | 1200 | 3100 | |
| b=1000 | 1000 | 105 | 200 | 70 | |
| b=2000 | 1000 | 7 | 80 | 0 | |

| 38a | 38b | 38c | 38d | 37 |
|---|---|---|---|---|
| 1732,051 | 2102,635 | 1219,180 | 3100,790 | |
| 0,000 | 1731,20594 | 1235,476 | 2504,975 | |
| 1071,084 | 1138,234 | 266,919 | 2125,335 | |
| 1308,185 | 1100,476 | 219,058 | 2101,096 | |
| 1377,662 | 1101,394 | 261,865 | 2100,099 | |
| 1401,083 | 1103,430 | 281,701 | 2100,636 | |
| 1732,051 | 2751,922 | 2750,709 | 2989,130 | |
| 1265,601 | 690,926 | 981,526 | 1313,962 | |
| 1568,439 | 195,767 | 804,286 | 1118,754 | |
| 1673,582 | 100,168 | 809,763 | 1100,409 | |
| 1710,771 | 121,303 | 820,355 | 1100,506 | |
| 3464,102 | 4260,173 | 4427,911 | 4194,628 | |
| 2088,916 | 1402,314 | 2040,304 | 1115,011 | |
| 2290,405 | 950,212 | 1811,923 | 354,851 | |
| 2389,303 | 901,093 | 1802,174 | 127,881 | |
| 2427,162 | 901,411 | 1807,562 | 101,132 | |
| 5196,152 | 5892,798 | 6135,666 | 5679,340 | |
| 3071,270 | 2400,602 | 3109,597 | 1751,372 | |
| 3173,202 | 1950,586 | 2820,737 | 1018,592 | |
| 3259,084 | 1902,333 | 2800,877 | 909,273 | |
| 6928,203 | 7569,747 | 7854,069 | 7274,263 | |
| 4099,893 | 3444,793 | 4181,345 | 2683,031 | |
| 4114,580 | 2957,020 | 3829,798 | 1996,608 | |
| 4188,014 | 2903,575 | 3800,916 | 1908,447 | |
| 4221,597 | 2900,036 | 3802,353 | 1900,123 | 39 |

| | | | | |
|---|---|---|---|---|
| M0 | 1000 | 2000 | 1000 | 3000 |
| ADC | 0 | 3 | 2 | 4 |

METHOD AND MAGNETIC RESONANCE APPARATUS FOR DETERMINING DIFFUSION PARAMETERS

BACKGROUND OF THE INVENTION

Field of the Invention

The present invention concerns a method for determining at least one diffusion parameter for an examination subject, and to magnetic resonance (MR) apparatus and an electronically readable data storage medium for implementing such a method.

Description of the Prior Art

MR diffusion imaging is an important diagnostic tool in seeking answers to neurological and oncological questions. The importance of MR diffusion imaging continues to grow also in other clinical fields as well, such as orthopedics and cardiology. Instead of analyzing diffusion-weighted original images, radiology usually analyzes derived images or maps such as trace images, ADC maps (maps of the apparent diffusion coefficient) or what are known as FA maps, which represent the fractional anisotropy. These derived representations are normally based on models of the diffusion process: assuming free diffusion, the signal decays, for example, using a Gaussian operator as a function of the diffusion weighting, the b-value, according to the formula $S(b)=M_0 \exp(-b \, ADC)$, where $M_0$ stands for the signal without diffusion weighting, i.e. when b=0.

Often a model function is adapted to the acquired data in order to determine the derived representations, or in other words the derived diffusion parameters. In this process, nonlinear regression is used, for example, to determine the model parameters such that a cost function, for instance the sum of residuals of measured values and model function, is minimized.

As the models increase in complexity, however, so does the likelihood that these regression techniques do not find the wanted global minimum of the cost function but instead the technique returns frequently sub-optimum results representing merely a local minimum.

SUMMARY OF THE INVENTION

An object of the present invention is to improve the calculation of the diffusion parameters so as to ensure that the correct diffusion parameters are calculated and so that the model parameters or diffusion parameters are identified that produce a globally optimized match to the measured MR signals.

According to a first aspect of the invention, a method for determining at least one diffusion parameter for an examination subject using MR signals is provided, wherein MR signals are acquired in a number of diffusion measurements (data acquisitions), wherein each diffusion measurement is measured using a defined set of MR parameters, and wherein the number of diffusion measurements differ with respect to each other in terms of at least one MR parameter. This produces a measured MR signal dataset, in which are saved the MR signals for the different MR parameters used. This means that for every diffusion measurement, at least one of the MR parameters of the set has been changed, with no set of MR parameters used in the various diffusion measurements being the same. In addition, a multiplicity of calculated datasets is determined using a model, wherein the model describes the change in the MR signals for the diffusion measurements carried out, and wherein a defined number of different model parameters is used for all the calculated datasets. For each combination of the different model parameters and for different values of the model parameters, an MR signal intensity is calculated for the diffusion measurements. These calculated datasets can either be calculated in advance or stored in a lookup table, or, especially for simple models, they are calculated for the particular diffusion measurement when the method is being used. Then the measured MR signal dataset is compared with the multiplicity of the calculated datasets in order to identify the calculated dataset that, on the basis of a quality criterion, has the closest match to the measured MR signal dataset. Finally, the at least one diffusion parameter is determined from the calculated dataset having the closest match, wherein the at least one diffusion parameter is determined from the model parameters that were used in determining the calculated dataset having the closest match.

The method according to the invention uses a pattern recognition technique, which employs an extensive search instead of a regression technique. The dataset that has the best match to the measured MR signal dataset is identified from the collection of the calculated datasets. The model parameters forming the basis of this calculated dataset constitute the results being sought. The different sets of the MR parameters do not mean, however, that the measurement cannot be repeated with the same parameters in order to increase the signal. This, however, is considered to be one dataset.

In the method, a number of MR diffusion images can be generated from the MR signals, for example, for which images the signal intensity over time in the individual pixels of the MR diffusion images is considered in order to create a measured MR signal data vector for each pixel. The measured MR signal data vector then represents the measured signal intensities for the different MR parameters used, which were employed in the various diffusion measurements. For instance if three diffusion measurements were produced using three different diffusion weightings, then the MR signal data vector contains for each pixel, or for each combination of pixels, the respective signal intensities for the three different diffusion weightings.

For example if N diffusion measurements are performed using N different sets of the MR parameters, it is possible for a defined combination of the model parameters to calculate the signal intensity for the N sets of the MR parameters in order to create a calculated data vector for this defined combination of the model parameters and the N values used for the MR parameters. In addition, the calculated data vector is determined for all possible combinations of the values of the model parameters, thereby generating a multiplicity of different calculated data vectors. Each of the calculated data vectors hence represents the MR signal intensities for N diffusion measurements when using the defined combination of the model parameters.

Thus a multiplicity of calculated data vectors are determined. These data vectors are the same size as the measured MR signal data vectors, because the calculated data vector represents the calculated signal values for the N diffusion measurements for a defined combination of the model parameters.

When identifying the calculated dataset that has the closest match to the measured MR signal dataset, it is now possible to compare the measured MR signal data vector with the multiplicity of different calculated data vectors, wherein the calculated data vector is identified that has the closest match to the measured MR signal vector.

Obviously the comparison between the calculated datasets and the MR signal dataset is not limited to the use of vectors. Any other option can be used for which the measured signal intensities for the N MR parameters are compared with the sum of the calculated datasets.

For the comparison, it is possible that both the measured MR signal dataset and the multiplicity of the calculated datasets are normalized before the comparison. This simplifies the comparison, and the magnetization $M_0$, which equals the magnetization without diffusion weighting, can be used for the normalization.

During the acquisition of the number of diffusion measurements for example, it is possible to use as the different MR parameters during the acquisition of the multiple diffusion measurements, different diffusion weightings, for instance different b-values, where the b-value, as is known, is the measure of the diffusion weighting and depends on the gyromagnetic ratio, the gradient duration and the gradient amplitude and also the time length of the diffusion-weighted gradients.

The magnetization $M_0$ and a predetermined number of values of the magnetization $M_0$, for example, can be used for the different model parameters that are used to determine the calculated datasets; another model parameter is the apparent diffusion coefficient, ADC, with different values of this apparent diffusion coefficient being adopted in the model. Another possibility is to use the diffusion tensor and the different values of this tensor. For each value of the individual model parameter, this is combined with all the other values of the other varying model parameters, in order to cover all possible parameter combinations. It is possible here, for example, that the actual imaging parameters such as the echo time TE, the inversion time TI, repetition time TR etc. stay the same. Of course for more complex models, however, it is also possible to modify these parameters.

If the model parameters include the diffusion tensor, then, for example, for diffusion measurements at least three different diffusion measurements can be performed in different mutually orthogonal diffusion directions. If more than three diffusion directions are measured, for instance 4, then these should have a tetrahedral configuration. In order to be able to acquire at least the trace of the diffusion tensor, the directions must generally satisfy the following condition:

$$\Sigma_{n=1\ldots N} b_n = N/3 b 1$$

where $b_n = b\, g_i\, g_i^*$ is the b-matrix of the measurement having the unity direction $g_i$, N represents the number of measurements and 1 represents the unity matrix. For instance for the three orthogonal directions this gives $$g_1 = (1, 0, 0);\ g_2 = (0, 1, 0);\ g_3 = (0, 0, 1)$$

$$b_1 = b\begin{pmatrix}1 & 0 & 0\\0 & 0 & 0\\0 & 0 & 0\end{pmatrix}\quad b_2 = b\begin{pmatrix}0 & 0 & 0\\0 & 1 & 0\\0 & 0 & 0\end{pmatrix}\quad b_3 = b\begin{pmatrix}0 & 0 & 0\\0 & 0 & 0\\0 & 0 & 1\end{pmatrix}$$

$$\sum_{n=1\ldots 3} b_n = b\begin{pmatrix}1 & 0 & 0\\0 & 1 & 0\\0 & 0 & 1\end{pmatrix} = 3/3 * b * 1$$

For example it is possible to use the magnetization $M_0$ and six components of the diffusion tensor as the model parameters, wherein for calculating an isotropic (direction-dependent) diffusion, then for the dataset having the greatest similarity, the trace of the diffusion tensor can be used to determine a mean isotropic diffusion.

It is equally possible to determine an anisotropic (direction-independent) diffusion by determining an anisotropic diffusion tensor. In this case, for example, the magnetization $M_0$ and six components of the diffusion tensor can be used as the model parameters, wherein diffusion measurements are performed using at least two different diffusion weightings and at least six different diffusion directions.

In the diffusion measurement, the associated raw data space is preferably filled completely with raw data in accordance with the Nyquist condition. This means that reconstruction without aliasing artifacts is possible.

The invention also encompasses an associated magnetic resonance apparatus having an MR data acquisition scanner operated by a control computer, and a memory in which control information is stored that can be executed by the control computer. The MR apparatus is designed to perform the steps described above when the control information is executed in the control computer.

The present invention also encompasses a non-transitory, computer-readable data storage medium encoded with programming instructions that, when the storage medium is loaded into a computer or computer system of a magnetic resonance apparatus, cause the computer or computer system to operate the magnetic resonance apparatus so as to implement any or all of the embodiments of the method according to the invention, as described above.

DESCRIPTION OF THE PREFERRED EMBODIMENTS

The present invention is described in greater detail below using preferred embodiments with reference to the drawings. The same reference numbers denote identical or similar elements in the figures. In addition, the figures are schematic representations of various embodiments of the invention. The elements shown in the figures are not necessarily shown to scale but instead are depicted in a way that makes their function and purpose clear to those skilled in the art. The connections shown in the figures between functional units or other elements can also be implemented as an indirect connection, as a wireless connection or as a wired connection. Functional units can be implemented as hardware, software or a combination of hardware and software.

The concept of using an extensive search instead of a regression technique is described below. For a specified diffusion measurement, an assumed model is used as the basis for calculating the result comprising the possible diffusion-weighted signals for each possible combination of the model parameters. The calculated dataset that has the best match according to a defined quality criterion is identified from this collection of the modeled data. The model parameters forming the basis of this dataset then determine the diffusion parameter being sought. Although the amount of calculated data in this approach can become relatively large, currently available computing capacity is sufficient for this purpose.

Figure 1:
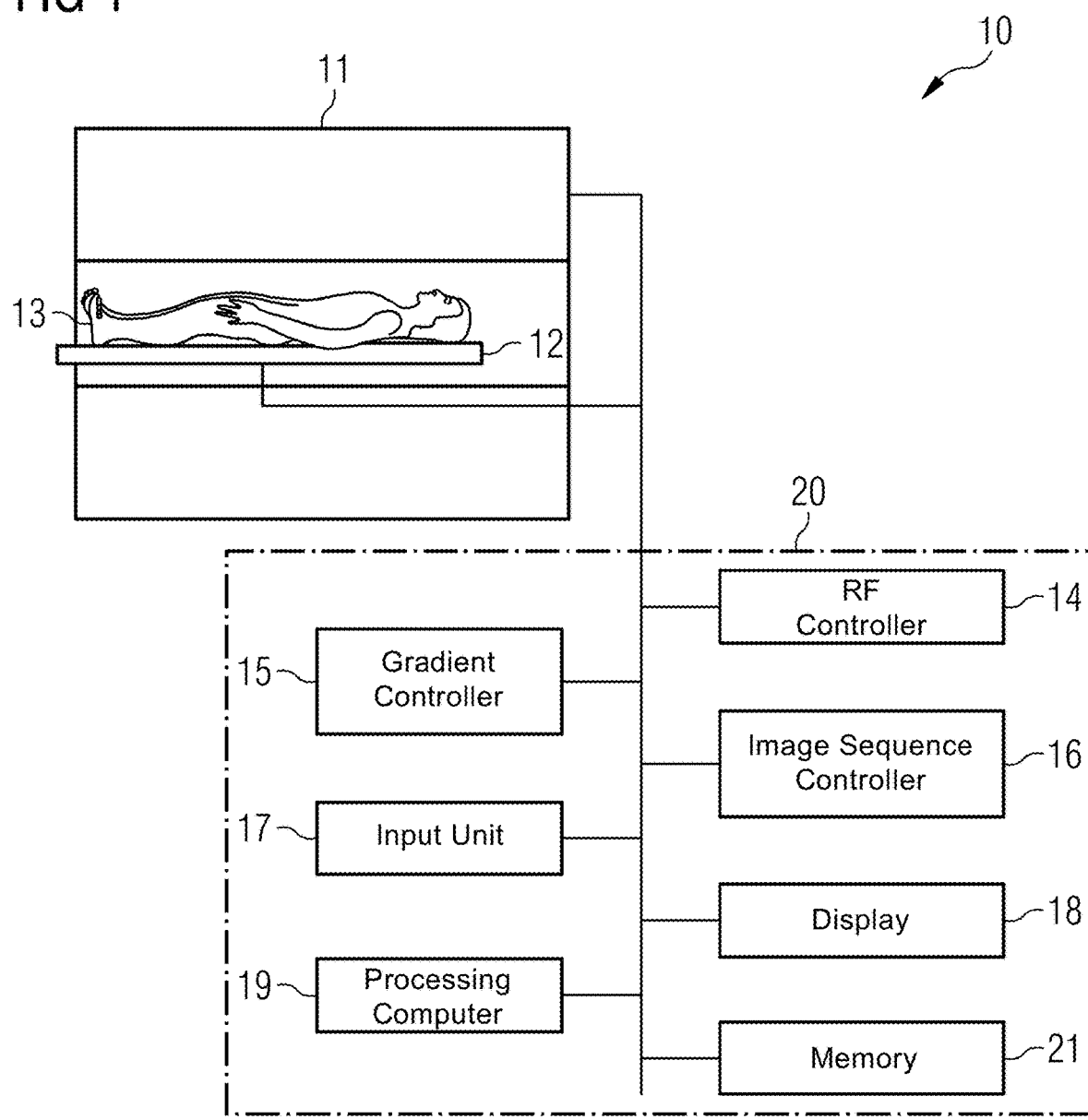
FIG. 1 schematically illustrates an MR apparatus that is operable according to the invention in order to calculate diffusion parameters.

FIG. 1 shows the MR apparatus that can be used for this purpose.

The MR apparatus 10 has a scanner 11 with a basic field magnet that generates a polarization field $B_0$. An examination subject 13 arranged on a couch 12 is moved into the scanner 11 in order to acquire spatially encoded magnetic resonance signals from the examination subject 13 in the center of the scanner 11. The coils used for applying the RF pulses and for signal acquisition, such as a whole body coil or one or more surface coils, are not shown for clarity. The scanner 11 can be designed for parallel imaging, in which the MR signals are detected simultaneously by a multiple of surface coils or a coil array. By applying RF pulses and switching magnetic field gradients, the magnetization produced by the polarization field $B_0$ is deflected out of the equilibrium position and is spatially encoded, and the resultant magnetization is detected by the reception coils. The principles of how MR images are produced by applying RF pulses and switching magnetic field gradients in various combinations and sequences are known to those skilled in the art, thus need not be explained further herein.

The MR apparatus 10 also comprises a control computer 20, which controls the MR apparatus 10. The control computer 20 has a gradient controller 15 for controlling and switching the necessary magnetic field gradients. An RF controller 14 is provided for the generation of the RF pulses for deflecting the magnetization. An image sequence controller 16 controls the sequence of the magnetic field gradients, of the RF pulses and of the signal detection and hence indirectly controls the gradient controller 15, the RF controller 14 and the coils (not shown). An operator can control the MR machine via an input unit 17, and MR images and other information needed for control can be displayed on a display 18. A processing computer 19 being at least one processor is provided for controlling the various units in the control computer 20. The processing computer 19 can be designed, as explained below, to use acquired MR signals and calculated datasets to determine a diffusion parameter, as explained in detail below. In addition, a memory 21 is provided, program modules and/or programs are stored that control the process flow of the MR apparatus 10 when they are executed by the processing computer 19 or its processor.

The method shall now be explained with reference to some examples, which increase in complexity.

First Example

In the first example, the direction-specific free diffusion shall be determined as a diffusion parameter for a person under examination, where the diffusion along a specified spatial direction is intended. The magnetization $M_0$ without diffusion weighting and the apparent diffusion coefficient ADC are used as the model parameters for the datasets to be calculated for the signal simulation of the MR signals. For this example, diffusion measurements using at least two different diffusion weightings $b_1, b_2, \ldots, b_N$ are measured, in which measurements all the other MR parameters such as the diffusion direction, the echo time or repetition time stay the same. This means that the diffusion measurement is measured using a defined set of MR parameters, with only the diffusion weighting b changing from measurement to measurement. Equation 1 below is used as the model for the change in the MR signals:

$$S_i' = M_0 \exp(-b_i \text{ADC}_R)) \quad (1)$$

In addition, a multiplicity of datasets are calculated, which show the expected signal intensities $S_i'$ for the different values of the model parameters $M_0$ and ADC for each of the b-values of the diffusion measurements, i.e. N diffusion measurements in total. For instance the quantified values $0, 5, 10, \ldots, 5000$ can be used for the magnetization $M_0$, and the values $\{0, 0.01, 0.02, \ldots, 4.00\} * 10^{-3}$ mm2/s for ADC. This results in 1001 possible values for the magnetization and 401 possible values for the model parameter ADC. Expressed in general terms, X possible values are adopted for the first model parameter M1, and Y different values for the second model parameter. For each value combination, the signal intensity $S_i'$ is then calculated for the N diffusion measurements using the N different diffusion weightings. This produces a matrix of X*Y matrix components, where each matrix component can be regarded as a signal vector $S_i'$ where $S_i'$ is equal to $(S_1', S_2', \ldots, S_N')$. Each of these data vectors indicates the signal intensity expected for the set of N measurements assuming a specific combination of the model parameters, in this case a combination of the different values of the magnetization $M_0$ and of the ADC.

Figure 2:
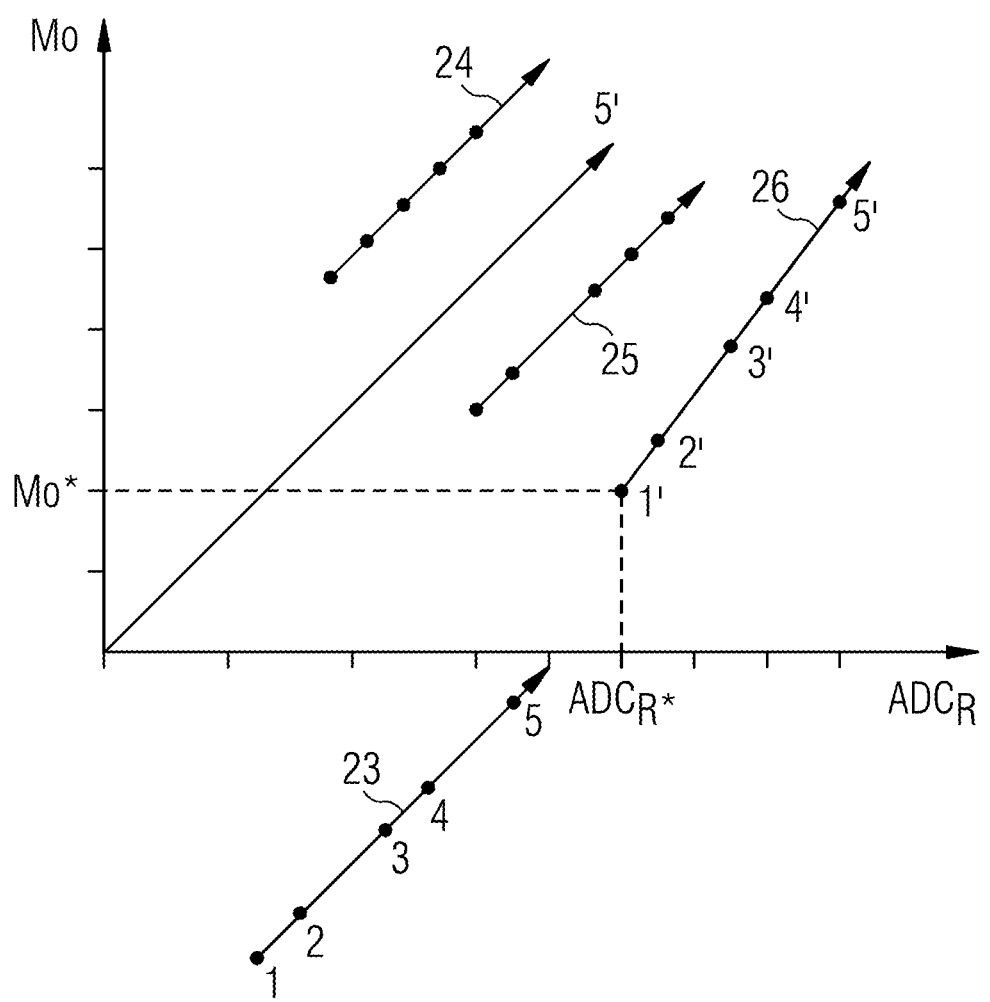
FIG. 2 schematically illustrates how, by comparing a measured MR signal vector with calculated data vectors, the data vector that has the greatest similarity or the closest match can be found.
Figures 3, 3A:
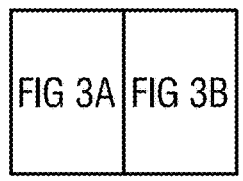
FIG. 3 (divided into FIGS. 3A and 3B) schematically illustrates an example of the measured MR signal datasets and the calculated datasets that were calculated on the basis of the model parameters, wherein a sought diffusion parameter can be determined by comparing this data.

This is explained in greater detail in the example illustrated in FIGS. 2 and 3.

It is assumed that diffusion measurements are acquired using three different diffusion weightings, i.e. three different b-values, where the signal variation is given by equation 1 and the b-values 0, 1000 and 2000 are used. The MR parameter that is varied is thus the diffusion weighting. The magnetization $M_0$ and the apparent diffusion coefficient ADC are used here as the model parameters, where for reasons of clarity only very coarse grids are used, such as the M0 values 0, 1000, 2000, 3000, 4000 and 5000. The values 0, 1, 2, 3, 4 are used as the different ADC values. Table 31 in FIG. 3 shows the possible combinations of the different model parameters, where column 32 shows the values of the magnetization, and column 33 shows the possible different values of the apparent diffusion coefficient. For the various combinations of the model parameters, the signal is then calculated for the three different diffusion weightings of 0, 1000 and 2000, as shown in table 34. This produces the three different calculated MR signal intensities for each parameter combination.

The right part of FIG. 3 then shows for different measurements the signal intensities that result for the different diffusion weightings b=0, 1000 and 2000. This produces table 35, in which are entered the signal intensities for the measurements. The measured signal intensities can then be regarded as the measured MR signal vector 36a, 36b, 36c and 36d, where in the example shown, each signal vector has three components, for instance the signal data vector 36c has the intensity values 1200, 200 and 80. These MR signal data vectors 36a to 36d can then each be compared with the multiplicity of different calculated signal intensities, where each row of the table 34 can likewise be interpreted as a vector, for instance the data vector 34a or the data vector 34b. The individual signal vectors 36a to 36d are then compared with the individual rows of the table 34 in order to determine the closest match or greatest similarity. Hence the measured MR signal data vector is compared with the multiplicity of calculated data vectors, where the closest agreement can be calculated by the maximum of the inner product, for example. It is also possible to find the closest match by determining the Euclidean distance, as has been used in table 37. The individual columns 38a to 38d each show the calculated Euclidean distance between the associated measurement and each of the model combinations from table 34. For the measured MR signal data vector 36b having the values 2100, 105 and 7, the Euclidean distance is a minimum, for example, for the data vector 34b, which means that the associated magnetization M0 equaled 2000 and the apparent diffusion coefficient equaled 3. The values of $M_0$ and ADC for the other measurements can then be determined in a similar manner, and the results for each are summarized in table 39.

FIG. 2 shows this association graphically. In the example shown there it is assumed that five different diffusion weightings, i.e. five different b-values, have been used in producing the MR diffusion measurements. This results in a data vector 23 having five components, namely in the signal data vector. This signal data vector can be compared with the parameter space in which the different calculated data vectors lie. In the example shown, as in FIG. 3, these were different values of the magnetization $M_0$ and the diffusion coefficient ADC. For reasons of clarity, only three of the calculated data vectors are shown, specifically the data vectors 24, 25 and 26. Of course this calculated data vector exists for each quantified value of $M_0$ and ADC that is used. The calculated signal intensity is then plotted in the third dimension, into the drawing plane. In the example shown, the signal data vector 23 matches most closely the calculated data vector 26, which is obtained graphically from the sequence of the measured signal intensities. The data points 1-5 of the MR signal data vector correspond in their position closest to the data points $S_1'$ to $S_5'$ of the calculated data vector 26, and the model parameters $M_0$ and ADC can then be read off from the axes, in this case the values $M_0^*$ and ADC*. In other words, the five points of the MR signal vector can be associated with a brightness level (signal amplitude); similarly, all the points of the data vectors would have the brightness values calculated according to the model. It is then possible to identify the vector that has the best match: the position of the associated data vector then determines the associated model parameters M0 and ADC.

As explained above, regression is not needed for calculating the desired diffusion parameters, in this case the difference parameter ADC. The search over all the modeled datasets, or calculated data vectors, unequivocally results in the global optimum.

Second Example

In a second example, the intention is to determine what is the average diffusion in three dimensions, i.e., to determine the isotropic free diffusion. This corresponds to the trace of the diffusion tensor. Once again the magnetization $M_0$ and six different components of the diffusion tensor are used as the model parameters. As diffusion measurements, MR data is acquired for at least two different diffusion weightings $b_1$, $b_2, \ldots, b_N$ and at least three different diffusion directions $g_1$, $g_2, \ldots, g_N$ for at least one non-zero diffusion weighting. All the other imaging parameters such as echo time or repetition time stay the same. The equation below is used as the model for the change in the MR signals:

$$S_i' = M_0 \exp(-B_i : D) \qquad (2)$$

where $B_i$ represents the b-matrix of the measurement of index i, and D the diffusion tensor. The tensor product B:D is defined by the following equation:

$$B:D = B_{xx}D_{xx} + B_{yy}D_{yy} + B_{zz}D_{zz} + 2B_{xy}D_{xy} + 2B_{xz}D_{xz} + 2B_{yz}D^{yz} \qquad (3)$$

The at least three diffusion directions can be selected here such that the conditions for trace-weighted images are met. This means that if, for example, three diffusion directions are measured for one b-value, then these must be mutually orthogonal. If four different directions are measured, then these should have a tetrahedral configuration.

For example, the signal intensities $S_i$ predicted for each b-value of the i=1 N measurements are calculated for $M_0 \in \{0, 5, 10, \ldots, 5000\}$, $D_{xx}, D_{yy}, D_{zz}, D_{xy}, D_{xz}, D_{yz} \in \{0, 0.01, 0.02, \ldots, 4.00\} * 10\text{-}3$ mm2/s. It is assumed here that for the measurement the value range for $M_0$ extends from 0 to 5000 (1001 possible values) and the range for the components of the diffusion tensor extends from 0 to $4*10\text{-}3$ mm2/s (401 possible values).

The vector that best reproduces the measurement is determined by comparing the measured signal data vector $S=(S_1, S_2, \ldots, S_N)$ with the multiplicity of simulated vectors S'. It should be noted that it is not possible to determine uniquely all the components of the diffusion tensor with, for instance, just three measured directions; a plurality of simulated signal vectors can describe the measured signal intensity vector equally well. Suitable selection of the directions (as described above), however, does ensure that each of these simulated signal vectors is associated with a diffusion tensor having an identical trace: the sum of the diagonal elements $Tr(D) = D_{xx} + D_{yy} + D_{zz}$ gives directly the isotropic (average) diffusion coefficient being sought. Alternatively, it is also possible to calculate initially a trace-weighted image in a conventional manner for each acquired diffusion weighting, for instance by taking the geometric mean given by $$S_{TR} = \exp(1/M \Sigma \ln(S_m)), \qquad (4)$$

where the sum is formed over the M directions acquired for the b-value. Modeling similar to example 1 is then employed.

Once again the magnetization $M_0$ and the ADC are used as the model parameters, where the latter is not direction-specific. As the diffusion measurements, measurements are performed using at least two different diffusion weightings and at least 3 decided diffusion directions, for which non-zero diffusion weightings are used, in which all the other imaging parameters or model parameters stay the same. The calculated datasets are modeled using the following equation:

$$\text{Modeling of the database: } S_{TR,i}' = M_0 \exp(-b \text{ADC}) \qquad (5)$$

For example, the signal intensities $S_{TR,i}'$ predicted for each b-value of the i=1 ... N measurements are calculated for $M_0 \in \{0, 5, 10, \ldots, 5000\}$ and for ADC $\in \{0, 0.01, 0.02, \ldots, 4.00\} *10\text{-}9$ mm2/s. It is assumed here that for the measurement the value range for M0 extends from 0 to 5000 (1001 possible values) and the range for the ADC extends from 0 to $4*10\text{-}3$ mm2/s (401 possible values). The vector that best reproduces the measurement is determined by comparing the measured signal intensity vector $STR=(S_1, S_2, \ldots, S_N)$ with the multiplicity of simulated vectors STR'.

Third Example

In the third example described below, free diffusion takes place in three spatial directions, with the model parameters $M_0$ and six components of the diffusion tensor being used for the calculated datasets. The diffusion measurements are again performed at least using two different diffusion weightings $b_1$ to $b_N$ and at least six of the cited diffusion directions $g_1$ to $g_N$ for at least one of the non-zero diffusion weightings, where once again all the other parameters stay the same. The equation below is used as the model for calculating the datasets:

$$\text{Modeling of the database: } S_i' = M_0 \exp(-B_i{:}D) \quad (6)$$

where $B_i$ represents the b-matrix of the measurement, and D the diffusion tensor. The tensor product B:D is defined as $B{:}D = B_{xx} D_{xx} + B_{yy} D_{yy} + B_{zz} D_{zz} + 2 B_{xy} D_{xy} + 2 B_{xz} D_{xz} + 2 B_{yz} D_{yz}$. The at least six diffusion directions must be selected such that the conditions for tensor determination are met. For example, the signal intensities $S_i'$ predicted for each b-value of the i=N measurements are calculated for $M_0 \in \{0, 5, 10, \ldots, 5000\}$, $D_{xx}, D_{yy}, D_{zz}, D_{xy}, D_{xz}, D_{yz} \in \{0, 0.01, 0.02, \ldots, 4.00\}*10\text{-}9 \text{ mm}2/\text{s}$. It is assumed here that for the measurement the value range for $M_0$ extends from 0 to 5000 (1001 possible values) and the range for the components of the diffusion tensor extends from 0 to $4*10\text{-}3 \text{ mm}2/\text{s}$ (401 possible values). The vector that best reproduces the measurement is determined by comparing the measured signal data vector $S = (S_1, S_2, \ldots, S_N)$ with the multiplicity of simulated vectors $S'$. Unlike example 2, the at least six non-collinear directions allow all the tensor components to be determined for at least one non-zero b-value. Derived parameter maps such as ADC, FA, . . . can be calculated in the usual manner from the diffusion tensor determined in this way.

The procedure described above can be extended to more complex models containing additional model parameters. In this case, higher-order tensor models can be used, for example diffusion kurtosis. In addition, multi-tensor models can be used or microscopic fiber models or multi-component models. It is equally possible to use microstructure models. If a larger number of model parameters is used then this usually requires a larger number of diffusion measurements, for instance using additional diffusion directions and/or diffusion weightings. Microstructure models can also require that additional experimental parameters are varied, and these parameters are taken into account in the modeling. For example, it may be necessary to vary the timing of the diffusion encoding, such as the encoding time or evolution time for instance.

In the models described above, measurements were limited in the sense that "all the other parameters (TE, TR, . . . )" stay the same. Provided the effect of additional parameters on the signal intensity can be modeled, the model can be extended accordingly and the limitations reduced. For instance if the echo time TE (for constant TR) varies, the measured signal intensity experiences a corresponding variation according to the T2 relaxation. This can be taken into account by adding a factor $\exp(-TE/T2)$ to the modeling. It is hence possible, for example, to perform each individual measurement using the minimum possible echo time for the selected b-value, and thereby maximize the SNR. Large b-values require steeper and longer diffusion encoding gradients then smaller b-values; thus a shorter TE can be sufficient for the latter. Varying the repetition time TR produces modulations in the longitudinal magnetization available at the start of a measurement. Although modeling that involves the T1 relaxation time is more complex, it remains manageable, for instance using Bloch simulation techniques.

Figure 4:
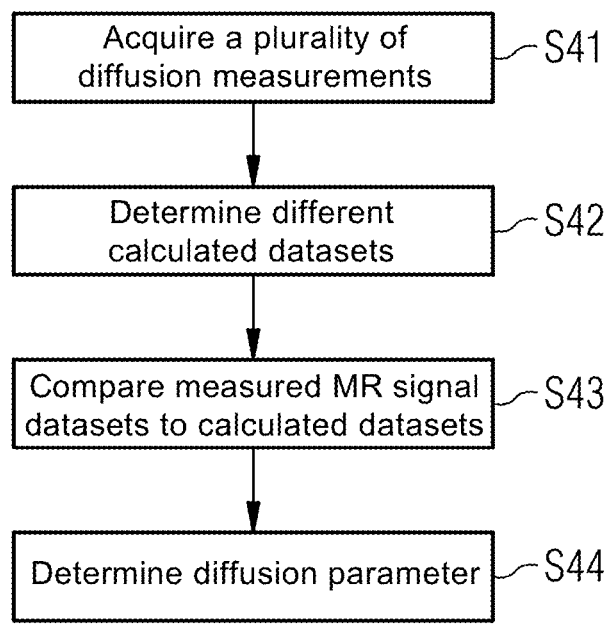
FIG. 4 is a flowchart of basic steps for performing the method in which the diffusion parameter is determined according to the invention.

FIG. 4 re-summarizes the essential steps in the method described above. In a step S41, the plurality of diffusion measurements are acquired, wherein each diffusion measurement comprises a defined set of MR parameters, and wherein in each diffusion measurement a parameter of the MR dataset is varied, for instance the diffusion weighting b as described above. In a further step S42, the numerous different calculated datasets are determined as shown by way of example in tables 34 and 31 in FIG. 3 (divided into FIGS. 3A and 3B). For each quantified value of the model parameters and for each combination of the model parameters, signal intensities are calculated for the different diffusion measurements, resulting in the calculated datasets such as are shown in table 34. In a step S43, the measured MR signals, i.e. the MR signal dataset, are compared with the multiplicity of the calculated datasets in order to identify the calculated dataset having the closest match. In a step S44, the desired diffusion parameter can then be determined, with this being obtained from the model parameters that were used in the calculated dataset having the closest match.

The model parameters described above were located on an equidistant grid. The model parameters can also lie on a non-equidistant grid, however. For example, for larger parameter values, larger intervals between the individual values of the model parameters can be used, or the parameter values can be incremented logarithmically so that the relative accuracy is still retained.

It is possible to normalize the MR signal dataset and the calculated datasets, thereby dispensing with the model parameter $M_0$ for example. The measurement data should likewise be normalized accordingly for this purpose. In some cases, acquisition without diffusion weighting suffices as a reference, to which all other acquisitions are normalized. If different echo times TE are used for the diffusion measurements, a reference measurement without diffusion weighting, for example, can be performed for each echo time and used for normalization.

The calculated datasets can be pre-calculated for a predetermined model and a defined set of MR parameters, and be held in the memory. This is suitable in particular for more complex models for which calculating the individual signal datasets takes a relatively long time.

Alternatively, it is possible to calculate the calculated datasets during use "on the fly" so to speak. This approach is usually sufficiently fast for simple models and has the advantage that it is possible to react more flexibly to changes to the MR parameters during the diffusion measurements, for instance changes such as a different choice of b-values or diffusion weightings.

Conventionally acquired diffusion-weighted MR images can be used as the basis for the method described above. Alternatively, procedures with heavy subsampling can be employed in the data acquisition, with the sampling pattern being varied between the individual measurements. By virtue of the multiplicity of individual measurements and the comparison with the calculated data vectors, the artifacts resulting from subsampling can be reduced such that the diffusion data can be provided with sufficient diagnostic quality. Depending on the model used, the values of the model parameters can be restricted to a relevant value range, for example by exploiting special properties of the model used. For instance, when using the third example it is possible to exploit the special diffusion tensor properties. The tensor product of the b-matrix and the diffusion tensor describes a linear quadratic form with positively defined symmetric matrix D.

The b-matrix is expressed as $B_i = b_i * g_i^T$; i.e. $B_i:D$ can also be written as $b_i \, g_i^T \, D \, g_i$. Hence D can be diagonalized by a rotation matrix R so that $D = R^T \, D' \, R$ and D' is diagonal and $D'_{xx} \geq D'_{yy} \geq D'_{zz}$; i.e. the potentially possible values of D are determined by the three diagonal elements of D' and applying rotation matrices. Thus the process of simulating the tensors can be implemented by simulating different diagonal elements and the subsequent application of rotations.

Since the data from the calculated dataset and the mapping of simulated measurement data onto model parameters exist in advance, this can be used as training data for a learning algorithm, e.g. an artificial neural network (ANN), in order to estimate the model parameters implicitly on the basis of the measurement data. In this case, an ANN has as many input nodes as simulated measurement data points. The output nodes of the network provide the model parameters. Different numbers and topologies of hidden nodes can be used depending on the network architecture used and learning rules.

Although modifications and changes may be suggested by those skilled in the art, it is the intention of the Applicant to embody within the patent warranted hereon all changes and modifications as reasonably and properly come within the scope of the Applicant's contribution to the art.

The invention claimed is:

1. A method for determining at least one diffusion parameter for an examination subject using magnetic resonance (MR) signals, comprising:
    operating an MR data acquisition scanner in order to execute a scan of a subject to acquire MR signals in each of a plurality of diffusion measurements, wherein each diffusion measurement is implemented using a defined set of MR parameters, with the MR parameters in the respective defined sets differing from each other in terms of at least one MR parameter, thereby creating a measured MR signal dataset comprising the MR signals respectively acquired with the different sets of MR parameters;
    in a computer, determining a plurality of calculated datasets using a model, said model describing a change in the MR signals for said different diffusion measurements, with a defined number of diffusion model parameters being used, but in respectively different combinations, with the respective combinations producing a calculated MR signal intensity for the respective diffusion measurements;
    in said computer, comparing the measured MR signal dataset with the plurality of the calculated datasets in order to identify a calculated dataset that has a closest match to the measured MR signal dataset based on a quality criterion that is dependent on said MR signal intensity; and
    in said computer, determining at least one diffusion parameter from the calculated dataset having the closest match to the measured MR signal dataset, from the model parameters used to determine the calculated dataset having said closest match.

2. The method as claimed in claim 1, comprising generating a plurality N of MR diffusion images, each comprised of pixels, from the MR signals, for which images the signal intensity over time in the individual pixels of the MR diffusion images is used in order to create a measured MR signal data vector for each pixel,
    wherein the measured MR signal data vector comprises the measured signal intensities for the different MR parameters used, which were employed in the various diffusion measurements.

3. The method as claimed in claim 2, comprising performing said N diffusion measurements using N different sets of the MR parameters,
    wherein for a defined combination of the model parameters the signal intensity is calculated for the N sets of the MR parameters in order to create a calculated data vector for each defined combination of the model parameters and the N values used for the MR parameters,
    wherein the calculated data vector is determined for all possible combinations of the values of the model parameters in order to determine a plurality of different calculated data vectors, and
    wherein each calculated data vectors comprises the MR signal intensities for the N diffusion measurements when using the defined combination of the model parameters.

4. The method as claimed in claim 3, comprising identifying the calculated dataset that has the closest match to the measured MR signal dataset, by comparing the measured MR signal data vector with the plurality of different calculated data vectors, and the calculated data vector is determined that has the closest match to the measured MR signal data vector.

5. The method as claimed in claim 4, comprising normalizing both the measured MR signal dataset and the multiplicity of the calculated datasets before the comparison.

6. The method as claimed in claim 1, comprising, during the acquisition of the plurality of diffusion measurements, at least different diffusion weightings are used as the different MR parameters,
    wherein the MR signal intensity is calculated for each diffusion weighting and the possible combinations of the different model parameters and of the different values.

7. The method as claimed in claim 1, wherein the different model parameters are at least one model parameter from the group consisting of a magnetization that is produced without diffusion weighting, an apparent diffusion coefficient, and a diffusion tensor.

8. The method as claimed in claim 7, wherein the different model parameters comprise said diffusion tensor, and
    wherein for the diffusion measurements at least three different diffusion measurements are performed using different mutually orthogonal diffusion directions.

9. The method as claimed in claim 8, wherein the magnetization that is produced without diffusion weighting and six components of the diffusion tensor are used as the model parameters, and
    wherein for the calculated dataset having the greatest similarity, the trace of the diffusion tensor is used to determine a mean isotropic diffusion as the diffusion parameter.

10. The method as claimed in claim 8, wherein the magnetization that is produced without diffusion weighting and six components of the diffusion tensor are used as the model parameters,
    wherein diffusion measurements are performed using at least two different diffusion weightings and at least 6 different diffusion directions, and
    wherein, for the calculated dataset having the greatest similarity, all the tensor components of the diffusion tensor are determined in order to determine an anisotropic diffusion tensor as the diffusion parameter.

11. The method as claimed in claim 1, comprising, in the plurality of diffusion measurements, an associated raw data space is fully sampled in accordance with the Nyquist condition.

12. A magnetic resonance (MR) apparatus comprising:
an MR data acquisition scanner;
a computer configured to operate said MR data acquisition scanner in order to acquire MR signals in each of a plurality of diffusion measurements,
wherein each diffusion measurement is implemented using a defined set of MR parameters, with the MR parameters in the respective defined sets differing from each other in terms of at least one MR parameter, thereby creating a measured MR signal dataset comprising the MR signals respectively acquired with the different sets of MR parameters;
said computer being configured to determine a plurality of calculated datasets using a model, said model describing a change in the MR signals for said different diffusion measurements, with a defined number of diffusion model parameters being used, but in respectively different combinations, with the respective combinations producing a calculated MR signal intensity for the respective diffusion measurements;
said computer being configured to compare the measured MR signal dataset with the plurality of the calculated datasets in order to identify a calculated dataset that has a closest match to the measured MR signal dataset based on a quality criterion that is dependent on said MR signal intensity; and
said computer being configured to determine at least one diffusion parameter from the calculated dataset having the closest match to the measured MR signal dataset, from the model parameters used to determine the calculated dataset having said closest match.

13. A non-transitory, computer-readable data storage medium encoded with programming instructions, said storage medium being loaded into a computer of a magnetic resonance (MR) apparatus, and said programming instructions causing said computer to:
operate an MR data acquisition scanner in order to acquire MR signals in each of a plurality of diffusion measurements, wherein each diffusion measurement is implemented using a defined set of MR parameters, with the MR parameters in the respective defined sets differing from each other in terms of at least one MR parameter, thereby creating a measured MR signal dataset comprising the MR signals respectively acquired with the different sets of MR parameters;
determine a plurality of calculated datasets using a model, said model describing a change in the MR signals for said different diffusion measurements, with a defined number of diffusion model parameters being used, but in respectively different combinations, with the respective combinations producing a calculated MR signal intensity for the respective diffusion measurements;
compare the measured MR signal dataset with the plurality of the calculated datasets in order to identify a calculated dataset that has a closest match to the measured MR signal dataset based on a quality criterion that is dependent on said MR signal intensity; and
determine at least one diffusion parameter from the calculated dataset having the closest match to the measured MR signal dataset, from the model parameters used to determine the calculated dataset having said closest match.

* * * * *